US012341540B2

(12) United States Patent
Kitajima

(10) Patent No.: US 12,341,540 B2
(45) Date of Patent: Jun. 24, 2025

(54) RADIO FREQUENCY CIRCUIT, RADIO FREQUENCY MODULE, AND COMMUNICATION DEVICE

(71) Applicant: Murata Manufacturing Co., Ltd., Kyoto (JP)

(72) Inventor: Hiromichi Kitajima, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 415 days.

(21) Appl. No.: 17/823,987

(22) Filed: Sep. 1, 2022

(65) Prior Publication Data

US 2022/0416817 A1    Dec. 29, 2022

Related U.S. Application Data

(63) Continuation of application No. PCT/JP2021/000589, filed on Jan. 8, 2021.

(30) Foreign Application Priority Data

Apr. 10, 2020  (JP) ................. 2020-070729

(51) Int. Cl.
   *H04B 1/00*   (2006.01)
   *H04B 1/44*   (2006.01)
(52) U.S. Cl.
   CPC ............ *H04B 1/0053* (2013.01); *H04B 1/44* (2013.01)
(58) Field of Classification Search
   CPC .......... H04B 1/0053; H04B 1/44; H04B 1/00; H04B 1/38; H03H 7/38; H03H 7/46
   See application file for complete search history.

(56) References Cited

U.S. PATENT DOCUMENTS

| 9,374,056 B2* | 6/2016 | Bagger ................ H03G 3/3042 |
| 10,122,389 B2* | 11/2018 | Kim ..................... H04B 1/0053 |
| 2007/0042802 A1 | 2/2007 | Park et al. |
| 2015/0133067 A1 | 5/2015 | Chang et al. |
| 2020/0051942 A1 | 2/2020 | Nakazawa et al. |
| 2021/0028798 A1 | 1/2021 | Tahara |

FOREIGN PATENT DOCUMENTS

| JP | 2020-027975 A | 2/2020 |
| WO | 2020/017108 A1 | 1/2020 |

OTHER PUBLICATIONS

International Search Report for PCT/JP2021/000589 dated Mar. 16, 2021.

* cited by examiner

*Primary Examiner* — Ankur Jain

(74) *Attorney, Agent, or Firm* — McDonald Hopkins LLC

(57) ABSTRACT

A radio frequency circuit includes a switch that includes a terminal connected to an antenna connection terminal and terminals, a duplexer that is connected to the terminal and has a pass band including a communication band A, a duplexer that is connected to the terminal and has a pass band including a communication band B which is available for simultaneous communication with the communication band A, a switch that includes a terminal connected to the terminal and terminals, a duplexer that is connected to the terminal and has a pass band including a communication band C, and a transmit/receive filter that is connected to the terminal and has a pass band including a communication band D.

16 Claims, 7 Drawing Sheets

RADIO FREQUENCY CIRCUIT, RADIO FREQUENCY MODULE, AND COMMUNICATION DEVICE

CROSS REFERENCE TO RELATED APPLICATION

This is a continuation of International Application No. PCT/JP2021/000589 filed on Jan. 8, 2021 which claims priority from Japanese Patent Application No. 2020-070729 filed on Apr. 10, 2020. The contents of these applications are incorporated herein by reference in their entireties.

BACKGROUND ART

Technical Field

The present disclosure relates to radio frequency circuits, radio frequency modules, and communication devices.

In recent mobile phones, in addition to multimode capability enabling a single terminal to be compatible with a plurality of communication systems and multiband capability enabling a single terminal to be compatible with a plurality of communication bands, a simultaneous communication using a plurality of communication systems and/or a plurality of communication bands is desirable. For example, the Patent Document 1 discloses a front-end module compatible with carrier aggregation (CA).

Patent Document 1: U. S. Patent Application Publication No. 2015/0133067 Specification

BRIEF SUMMARY

In such prior art techniques, the number of terminals of a switch for connecting a plurality of filters increases, and in some cases, due to the parasitic capacitance of unconnected terminals of the switch (hereinbelow, referred to as off-capacitance), pass characteristics of the switch degrades.

Thus, the present disclosure provides a radio frequency circuit, a radio frequency module, and a communication device that enable an improvement of the pass characteristics of the switch.

A radio frequency module according to one aspect of the present disclosure includes: a first switch including a first terminal connected to an antenna connection terminal, a second terminal, a third terminal, and a fourth terminal; a first filter connected to the second terminal, the first filter having a pass band including a first communication band; a second filter connected to the third terminal, the second filter having a pass band including a second communication band, the second communication band being available for simultaneous communication with the first communication band; a second switch including a fifth terminal connected to the fourth terminal, a sixth terminal, and a seventh terminal; a third filter connected to the sixth terminal, the third filter having a pass band including a third communication band; and a fourth filter connected to the seventh terminal, the fourth filter having a pass band including a fourth communication band.

According to the radio frequency module according to an aspect of the present disclosure, it becomes possible to improve the pass characteristics of the switch.

DETAILED DESCRIPTION

Figure 1:
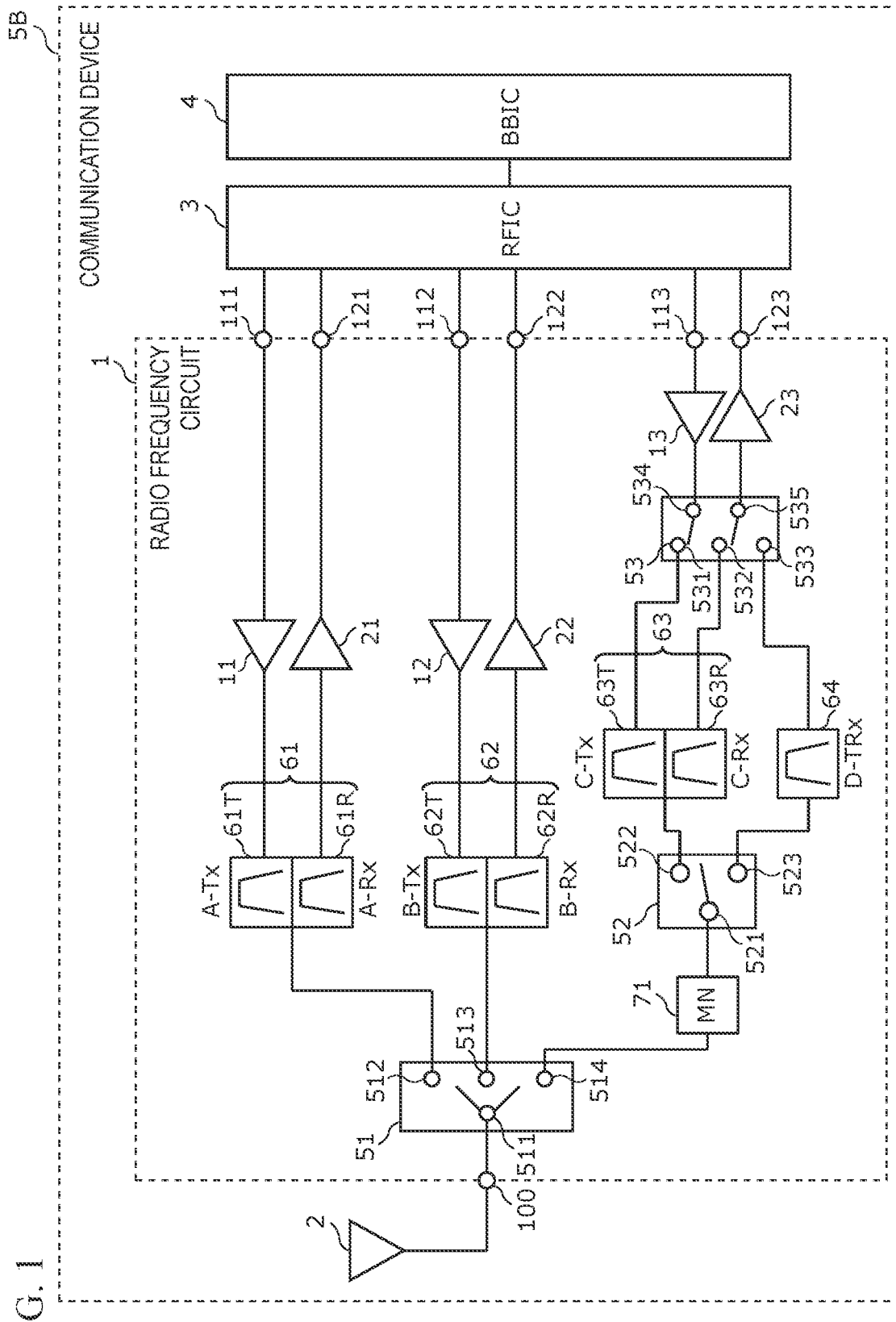
FIG. 1 is a circuit configuration diagram of a radio frequency circuit and a communication device according to an embodiment 1.

Hereinafter, embodiments of the present disclosure will be described in detail with reference to the drawings. Note that the embodiments which will be described below each illustrates a comprehensive or specific example. Numeric values, shapes, materials, constituent elements, arrangements and connection modes of the constituent elements, and the like illustrated in the following embodiments are mere examples, and not intended to limit the present disclosure.

Note that each drawing is a schematic diagram in which emphasis, omission, or ratio adjustment is carried out if appropriate to illustrate the present disclosure and is not precisely drawn, and in some cases, the shape, spatial relationship, and ratio are different from the actual ones. In all the drawing, same reference symbols are attached to substantially the same constituent elements, and in some cases, an overlapping description is omitted or simplified.

In each of the following drawings, the x-axis and y-axis are axes orthogonal to each other on a plane parallel to a principal surface of a module board. Further, the z-axis is an axis vertical to a principal surface of the module board, and the positive direction thereof indicates the up direction, and the negative direction thereof indicate the down direction.

Further, in the circuit configuration of the present disclosure, the term "connect" is defined to include not only the case of direct connection via a connection terminal and/or a wiring conductor but also include the case of electrical connection via another circuit element. Further, the term "connected between A and B" is defined to mean to be connected to both A and B in between A and B.

Further, in the component arrangement of the present disclosure, the term "plan view of the module board" is defined to mean that objects are viewed by orthographic projection from the positive side of the z-axis onto the x-y plane. Further, the term "A overlaps B in the plan view of the module board" means that at least part of the area of A orthographically projected onto the x-y plane overlaps at least part of the area of B orthographically projected onto the x-y plane. Further, the term "a component is arranged on a board" is defined to include not only the case where a component is arranged on a board while the component is touching the board but also the case where the component is arranged above the board without necessarily touching the board (for example, the component is stacked on another component arranged on the board) and the case where the component is arranged on the board in such a way that part or whole of the component is buried inside the board. Further, the term "a component is arranged on a principal surface of a board" is defined to include not only the case where a component is arranged on a principal surface of a board while the component is touching the principal surface of the board but also the case where the component is arranged above the principal surface of the board without necessarily touching the principal surface of the board and the case where the component is arranged on the board in such a way that part of the component is buried inside the board from the principal surface side.

Further, the terms indicating relationships among constituent elements, such as "parallel", "vertical", and the like are used not only to indicate their precise meanings but also to mean to include their substantially equivalent ranges, for example, to include an error of about several %.

Embodiment 1

[1.1 Circuit Configuration of Radio Frequency Circuit 1 and Communication Device 5]

A circuit configuration of a radio frequency circuit 1 and a communication device 5 according to the present embodiment is described with reference to FIG. 1. FIG. 1 is a circuit configuration diagram of the radio frequency circuit 1 and the communication device 5 according to the embodiment 1.

[1.1.1 Circuit Configuration of Communication Device 5]

First, the circuit configuration of the communication device 5 is described.

As illustrated in FIG. 1, the communication device 5 according to the present embodiment includes the radio frequency circuit 1, an antenna 2, a RFIC 3, and a BBIC 4.

The radio frequency circuit 1 transmits radio frequency signals between the antenna 2 and the RFIC 3. The internal configuration of the radio frequency circuit 1 will be described below.

The antenna 2 is connected to an antenna connection terminal 100 of the radio frequency circuit 1, transmits a radio frequency signal output from the radio frequency circuit 1, and receives a radio frequency signal from outside and outputs the radio frequency signal to the radio frequency circuit 1.

The RFIC 3 is an example of a signal processing circuit that performs processing on radio frequency signals. Specifically, the RFIC 3 performs signal processing on a radio frequency signal input via a receive path of the radio frequency circuit 1 using down-converting and the like, and outputs a receive signal generated by this signal processing to the BBIC 4. Further, the RFIC 3 performs signal processing on a transmit signal input from the BBIC 4 using up-converting and the like, and outputs a radio frequency transmit signal generated by this signal processing to a transmit path of the radio frequency circuit 1. Further, the RFIC 3 includes a control part that controls switches, amplifiers, and the like included in the radio frequency circuit 1. Note that part or all of the functions of the control part of the RFIC 3 may be installed in the outside of the RFIC 3, for example, may be installed in the BBIC 4 or the radio frequency circuit 1.

The BBIC 4 is a base band signal processing circuit that performs signal processing using an intermediate frequency band, which is lower in frequency than a radio frequency signal being transmitted by the radio frequency circuit 1. The signal being subjected to processing in the BBIC 4 is used as, for example, an image signal for image display and/or an audio signal for communication through a speaker.

Note that in the communication device 5 according to the present embodiment, the antenna 2 and the BBIC 4 are optional constituent elements.

[1.1.2 Circuit Configuration of Radio Frequency Circuit 1]

Next, the circuit configuration of the radio frequency circuit 1 is described. As illustrated in FIG. 1, the radio frequency circuit 1 includes power amplifiers 11 to 13, low-noise amplifiers 21-23, switches 51 to 53, duplexers 61 to 63, a transmit/receive filter 64, a matching circuit (MN) 71, the antenna connection terminal 100, radio frequency input terminals 111 to 113, and radio frequency output terminals 121 to 123.

The antenna connection terminal 100 is an example of an external connection terminal and is connected to the antenna 2.

Each of the radio frequency input terminals 111 to 113 is an example of the external connection terminal and is a terminal for receiving a radio frequency transmit signal from outside of the radio frequency circuit 1. In the present embodiment, the radio frequency input terminal 111 receives a transmit signal of a communication band A from the RFIC 3. Further, the radio frequency input terminal 112 receives a transmit signal of a communication band B from the RFIC 3. Further, the radio frequency input terminal 113 receives transmit signals of communication bands C and D from the RFIC 3.

Each of the radio frequency output terminals 121 to 123 is an example of the external connection terminal and is a terminal for providing a radio frequency receive signal to outside of the radio frequency circuit 1. In the present embodiment, the radio frequency output terminal 121 provides a receive signal of the communication band A to the RFIC 3. Further, the radio frequency output terminal 122 provides a receive signal of the communication band B to the RFIC 3. Further, the radio frequency output terminal 123 provides receive signals of the communication bands C and D to the RFIC 3.

The communication bands mean frequency bands predefined by a standards group for constructing a communication system using radio access technology (RAT) (for example, 3GPP (3rd Generation Partnership Project), IEEE (Institute of Electrical and Electronics Engineers), and the like) or any other similar group. As the communication bands, for example, 5GNR (5th Generation New Radio) bands, LTE (Long Term Evolution) bands, WLAN (Wireless Local Area Network) bands, and the like can be used.

The communication band A corresponds to a first communication band. The communication band A is a communication band available for simultaneous communication with each of the communication bands B to D and is a communication band to which frequency division duplex (FDD) is applied (hereinbelow, referred to as a FDD band). As the communication band A, for example, Band 1 for LTE or n1 for 5GNR (uplink: 1920-1980 MHz, downlink: 2110-2170 MHz) can be used.

That a plurality of communication bands is available for simultaneous communication means that a plurality of communication bands is allowed to be used for at least one of simultaneous transmission, simultaneous reception, and simultaneous transmission and reception. At that time, the use of a single communication band of the plurality of communication bands is not excluded. A combination of communication bands available for simultaneous communication is defined in advance by, for example, a standards group or the like.

The communication band B corresponds to a second communication band. The communication band B is a FDD band available for simultaneous communication with the communication band A.

As the communication band B, for example, Band 3 for LTE or n3 for 5GNR (uplink: 1710-1785 MHz, downlink: 1805-1880 MHz) can be used.

The communication band C corresponds to a third communication band. The communication band C is a FDD band available for simultaneous communication with the communication band A. As the communication band C, for example, Band 7 for LTE or n7 for 5GNR (uplink: 2500-2570 MHz, downlink: 2620-2690 MHz) can be used.

The communication band D corresponds to a fourth communication band. The communication band D is a communication band available for simultaneous communication with the communication band A and is a communication band to which time division duplex (TDD) is applied (hereinbelow, referred to as a TDD band). As the communication band D, for example, Band 41 for LTE or n41 for 5GNR (2496-2690 MHz) can be used.

The communication bands C and D overlap with each other at least partially. That is to say, at least part of the communication band C is included in the communication band D, and at least part of the communication band D is included in the communication band C.

Note that the communication band A is available for simultaneous communication with each of the communication bands B to D but is not limited thereto.
For example, the communication band A does not need to be available for simultaneous communication with the communication band C, or does not need to be available for simultaneous communication with the communication band D.

Note that the communication bands A to C are not limited to the FDD bands, and the communication band D is not limited to the TDD band. Each of the communication bands A to D may be either a FDD band or a TDD band.

Note that although Band 1, Band 3, Band 7, and Band 41 for LTE are exemplified as the communication bands A to D, the communication bands A to D are not limited thereto. For example, the communication bands A and B may be any two of Band 1, Band 3, Band 32, and Band 40 for LTE or may be any two of Band 25, Band 30, and Band 66 for LTE. Further, the communication bands A to D may be communication bands for 5GNR and/or WLAN.

The power amplifier 11 is capable of amplifying a radio frequency signal received by the radio frequency input terminal 111. Here, the power amplifier 11 is capable of amplifying a transmit signal of the communication band A input from the radio frequency input terminal 111.

The power amplifier 12 is capable of amplifying a radio frequency signal received by the radio frequency input terminal 112. Here, the power amplifier 12 is capable of amplifying a transmit signal of the communication band B input from the radio frequency input terminal 112.

The power amplifier 13 is capable of amplifying a radio frequency signal received by the radio frequency input terminal 113. Here, the power amplifier 13 is capable of amplifying transmit signals of the communication bands C and D separately input from the radio frequency input terminal 113.

The configuration of each of the power amplifiers 11 to 13 is not limited to a particular configuration. For example, at least one of the power amplifiers 11 to 13 may be a multi-stage amplifier. That is to say, at least one of the power amplifiers 11 to 13 may include a plurality of amplifying elements connected in cascade. Further, for example, at least one of the power amplifiers 11 to 13 may have a configuration that converts a radio frequency signal into differential signals (complimentary signals) for amplification. At least one of the power amplifiers 11 to 13 such as this is referred to as a differential amplifier in some cases. In this case, an output of at least one the power amplifiers 11 to 13 may be a differential signal.

The low-noise amplifier 21 is capable of amplifying a radio frequency signal received by the antenna connection terminal 100. In the present embodiment, the low-noise amplifier 21 is capable of amplifying a receive signal of the communication band A input from the antenna connection terminal 100 via the switch 51 and a receive filter 61R of the duplexer 61. A radio frequency signal amplified by the low-noise amplifier 21 is output to the radio frequency output terminal 121.

The low-noise amplifier 22 is capable of amplifying a radio frequency signal received by the antenna connection terminal 100. In the present embodiment, the low-noise amplifier 22 is capable of amplifying a receive signal of the communication band B input from the antenna connection terminal 100 via the switch 51 and a receive filter 62R of the duplexer 62. A radio frequency signal amplified by the low-noise amplifier 22 is output to the radio frequency output terminal 122.

The low-noise amplifier 23 is capable of amplifying a radio frequency signal received by the antenna connection terminal 100. In the present embodiment, the low-noise amplifier 23 is capable of amplifying a receive signal of the communication band C input from the antenna connection terminal 100 via the switch 51, a receive filter 63R of the duplexer 63, and the switch 53. Moreover, the low-noise amplifier 23 is capable of amplifying a receive signal of the communication band D input from the antenna connection terminal 100 via the switch 51, the transmit/receive filter 64, and the switch 53. A radio frequency signal amplified by the low-noise amplifier 23 is output to the radio frequency output terminal 123.

The duplexer 61 is an example of a first filter and has a pass band including the communication band A. The duplexer 61 enables FDD in the communication band A. The duplexer 61 includes a transmit filter 61T and the receive filter 61R.

The transmit filter 61T (A-Tx) is connected between the power amplifier 11 and the antenna connection terminal 100. The transmit filter 61T has a pass band including the uplink band of the communication band A. Accordingly, of the radio frequency signals amplified in the power amplifier 11, the transmit filter 61T enables a transmit signal of the communication band A to pass.

The receive filter 61R (A-Rx) is connected between the low-noise amplifier 21 and the antenna connection terminal 100. The receive filter 61R has a pass band including the downlink band of the communication band A. Accordingly, of the radio frequency signals input from the antenna connection terminal 100, the receive filter 61R enables a receive signal of the communication band A to pass.

The duplexer 62 is an example of a second filter and has a pass band including the communication band B. The duplexer 62 enables FDD in the communication band B. The duplexer 62 includes a transmit filter 62T and the receive filter 62R.

The transmit filter 62T (B-Tx) is connected between the power amplifier 12 and the antenna connection terminal 100. The transmit filter 62T has a pass band including the uplink band of the communication band B. Accordingly, of the radio frequency signals amplified in the power amplifier 12, the transmit filter 62T enables a transmit signal of the communication band B to pass.

The receive filter 62R (B-Rx) is connected between the low-noise amplifier 22 and the antenna connection terminal 100. The receive filter 62R has a pass band including the downlink band of the communication band B. Accordingly, of the radio frequency signals input from the antenna connection terminal 100, the receive filter 62R enables a receive signal of the communication band B to pass.

The duplexer 63 is an example of a third filter and has a pass band including the communication band C. The duplexer 63 enables FDD in the communication band C. The duplexer 63 includes a transmit filter 63T and the receive filter 63R.

The transmit filter 63T (C-Tx) is connected between the power amplifier 13 and the antenna connection terminal 100. The transmit filter 63T has a pass band including the uplink band of the communication band C. Accordingly, of the radio frequency signals amplified in the power amplifier 13, the transmit filter 63T enables a transmit signal of the communication band C to pass.

The receive filter 63R (C-Rx) is connected between the low-noise amplifier 23 and the antenna connection terminal 100. The receive filter 63R has a pass band including the downlink band of the communication band C. Accordingly, of the radio frequency signals input from the antenna connection terminal 100, the receive filter 63R enables a receive signal of the communication band C to pass.

The transmit/receive filter 64 (D-TRx) is an example of a fourth filter and is connected between the low-noise amplifier 23 and the antenna connection terminal 100. The transmit/receive filter 64 has a pass band including the communication band D. The transmit/receive filter 64 allows, of the radio frequency signals amplified in the power amplifier 13, a transmit signal of the communication band D to pass and allows, of the radio frequency signals input from the antenna connection terminal 100, a receive signal of the communication band D to pass.

The switch 51 is an example of a first switch and includes terminals 511 to 514. The terminal 511 is an example of a first terminal and is connected to the antenna connection terminal 100. The terminal 512 is an example of a second terminal and is connected to the duplexer 61. The terminal 513 is an example of a third terminal and is connected to the duplexer 62. The terminal 514 is an example of a fourth terminal and is connected to a terminal 521 of the switch 52 via the matching circuit 71.

With such connection configuration, for example, based on a control signal from the RFIC 3, the switch 51 enables to connect one of the terminals 512 to 514 to the terminal 511, and further enables to simultaneously connect any combination of the terminal 512 to 514 to the terminal 511. The switch 51 is made up of, for example, a multi-connection type switch circuit and is referred to as an antenna switch.

The switch 52 is an example of a second switch and includes a terminal 521 and terminals 522 and 523 that can be connected to the terminal 521. The terminal 521 is an example of a fifth terminal and is connected to the terminal 514 of the switch 51. The terminal 522 is an example of a sixth terminal and is connected to the duplexer 63. The terminal 523 is an example of a seventh terminal and is connected to the transmit/receive filter 64.

With such connection configuration, the switch 52 enables to connect one of the terminals 522 and 523 to the terminal 521, for example, based on a control signal from the RFIC 3. The switch 52 is made up of, for example, a SPDT (Single-Pole Double-Throw) type switch circuit.

The switch 53 includes terminals 531 to 535. The terminal 531 is connected to the transmit filter 63T. The terminal 532 is connected to the receive filter 63R. The terminal 533 is connected to the transmit/receive filter 64. The terminal 534 is connected to the power amplifier 13. The terminal 535 is connected to the low-noise amplifier 23.

With such connection configuration, the switch 53 connects at least one of the terminals 531 to 533 to the terminal 534 or 535, for example, based on a control signal from the RFIC 3. For example, in the case where a radio frequency signal of the communication band C is transmitted and received, the switch 53 connects the terminal 531 to the terminal 534 and connects the terminal 532 to the terminal 535. This enables FDD in the communication band C. Further, for example, in the case where a radio frequency signal of the communication band D is transmitted and received, the switch 53 switches and connects the terminals 534 and 535 to the terminal 533. This enables TDD in the communication band D. The switch 53 is made up of, for example, a multi-connection type switch circuit.

The matching circuit 71 is connected between the antenna connection terminal 100 and filters of the duplexer 63 and the transmit/receive filter 64. Specifically, the matching circuit 71 is connected between the terminal 514 of the switch 51 and the terminal 521 of the switch 52. The matching circuit 71 enables to provide impedance matching for both the input impedances of the duplexer 63 and the transmit/receive filter 64.

Note that some of circuit elements illustrated in FIG. 1 do not need to be included in the radio frequency circuit 1. For example, the radio frequency circuit 1 only needs to include at least the switches 51 and 52 and does not need to include other circuit elements.

Note that the numbers of duplexers and filters to be connected to the switch 51 and 52 are not limited to those illustrated in FIG. 1. For example, a filter that has a pass band including another communication band (for example, Band 32 and/or Band 40 for LTE) may be further connected to the switch 51.

[1.2 Effects and the Like]

As described above, the radio frequency circuit 1 according to the present embodiment includes the switch 51 that includes the terminal 511 connected to the antenna connection terminal 100 and the terminals 512 to 514, the duplexer 61 that is connected to the terminal 512 and has a pass band including the communication band A, the duplexer 62 that is connected to the terminal 513 and has a pass band including the communication band B which is available for simultaneous communication with the communication band A, the switch 52 that includes the terminal 521 connected to the terminal 514 and the terminals 522 and 523, the duplexer 63 that is connected to the terminal 522 and has a pass band including the communication band C, and the transmit/receive filter 64 that is connected to the terminal 523 and has a pass band including the communication band D.

This enables to connect the terminal 514 of the switch 51 to the terminal 521 of the switch 52, to which two filters (the duplexer 63 and the transmit/receive filter 64) are connected. Accordingly, when the communication bands A and B are used together for simultaneous communication while the communication bands C and D are not used for communication, it becomes possible to reduce the number of unconnected terminals in the switch 51. As a result, in the simultaneous communication of the communication bands A and B, it becomes possible to reduce the parasitic capacitance of the unconnected terminals of the switch 51 (hereinbelow, referred to as "off-capacitance"), suppress an increase in reflection coefficient due to degradation of the impedance matching, and improve pass characteristics of the switch 51. This enables the radio frequency circuit 1 to improve signal quality during the simultaneous communication of the communication bands A and B.

Figure 2:
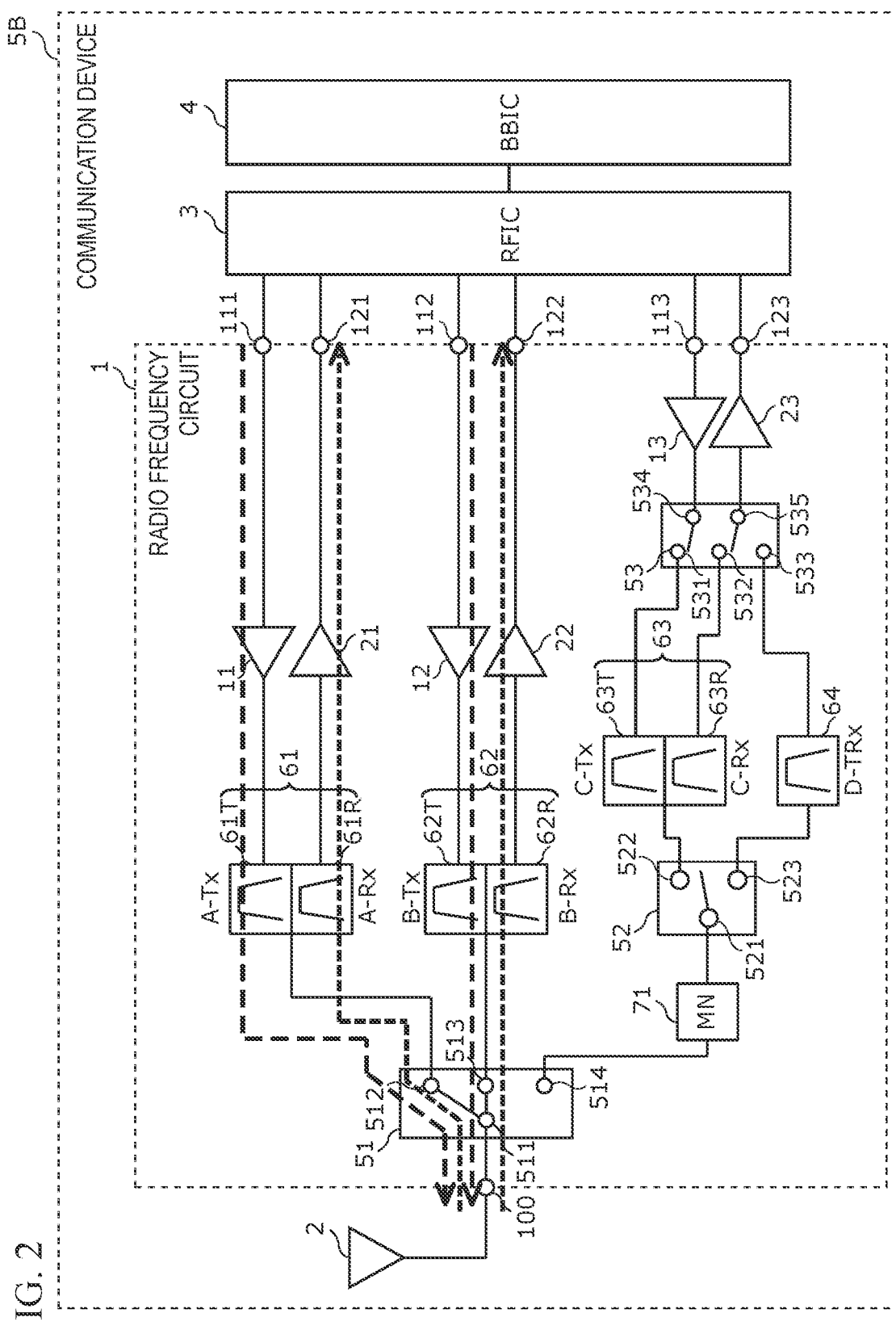
FIG. 2 is a circuit diagram illustrating an example of connecting state of the radio frequency circuit according to the embodiment 1.
Figure 3:
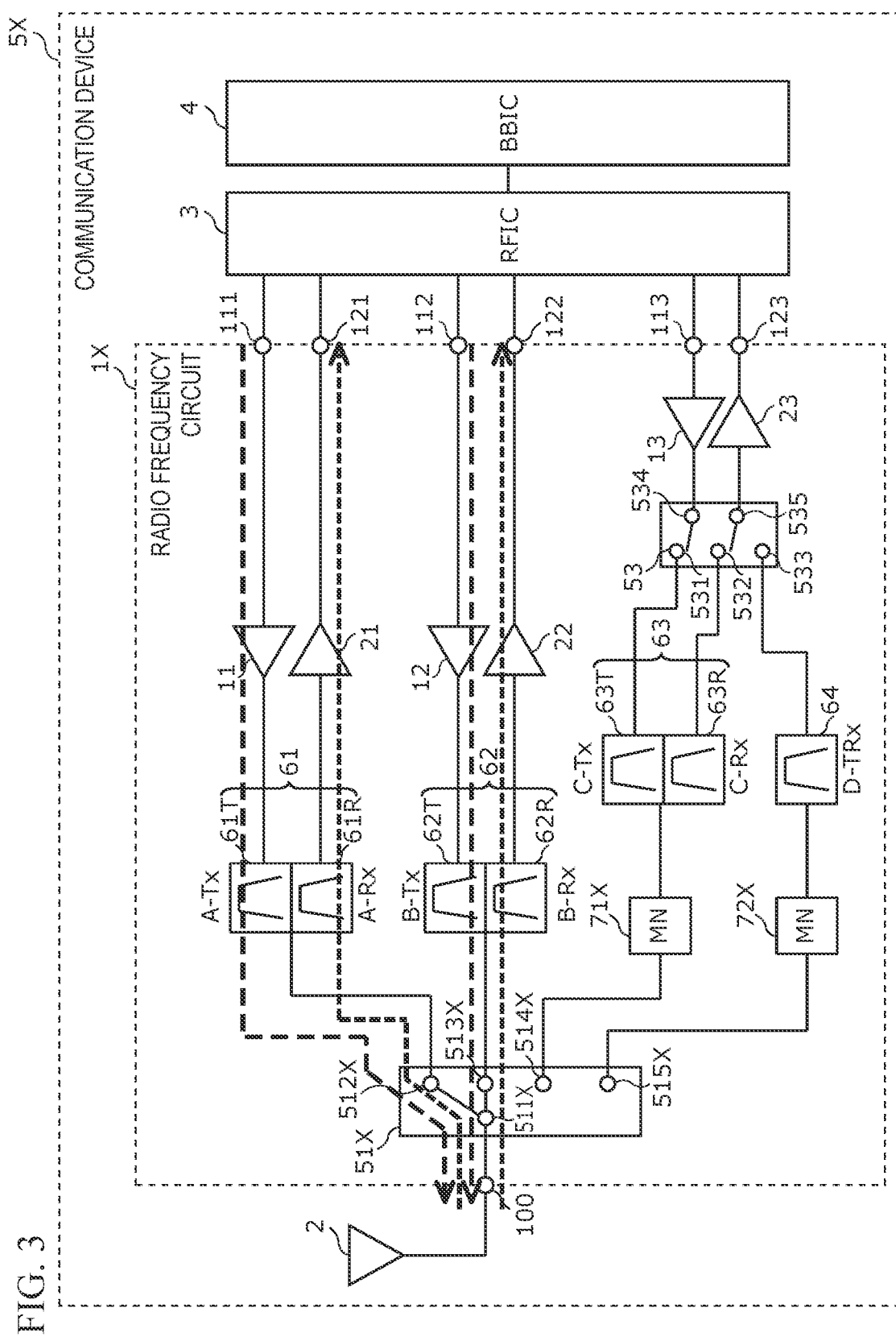
FIG. 3 is a circuit diagram illustrating an example of connecting state of a radio frequency circuit according to a comparative example.

Here, with regard to the reduction in number of the unconnected terminals of the switch 51, a specific description is provided referring to FIG. 2 and FIG. 3. FIG. 2 is a circuit diagram illustrating an example of connecting state of the radio frequency circuit 1 according to the embodiment 1. Further, FIG. 3 is a circuit diagram illustrating an example of connecting state of a radio frequency circuit 1X according to a comparative example. Both in FIG. 2 and FIG. 3, the dashed line arrow denotes the flow of a signal in the state where the simultaneous communication of the communication bands A and B is possible.

In the case where the simultaneous communication of the communication bands A and B is performed in the radio frequency circuit 1 according to the present embodiment, as illustrated in FIG. 2, for example, the RFIC 3 causes (a) the switch 51 to connect both the terminals 512 and 513 to the terminal 511 and not connect the terminal 514 to the terminal 511, and causes (b) the switch 52 to connect neither the terminal 522 nor 523 to the terminal 521. Because of this, a transmit signal of the communication band A is transmitted from the RFIC 3 to the antenna 2 via the radio frequency input terminal 111, the power amplifier 11, the transmit filter 61T, the switch 51, and the antenna connection terminal 100. Further, a receive signal of the communication band A is transmitted from the antenna 2 to the RFIC 3 via the antenna connection terminal 100, the switch 51, the receive filter 61R, the low-noise amplifier 21, and the radio frequency output terminal 121. Further, a transmit signal of the communication band B is transmitted from the RFIC 3 to the antenna 2 via the radio frequency input terminal 112, the power amplifier 12, the transmit filter 62T, the switch 51, and the antenna connection terminal 100. Further, a receive signal of the communication band B is transmitted from the antenna 2 to the RFIC 3 via the antenna connection terminal 100, the switch 51, the receive filter 62R, the low-noise amplifier 22, and the radio frequency output terminal 122.

On the other hand, in the radio frequency circuit 1X included in a communication device 5X according to the comparative example, as illustrated in FIG. 3, there is no switch 52, and filters of the communication bands A to D are separately connected to terminals of a switch 51X. Specifically, the duplexer 61 is connected to a terminal 512X of the switch 51X, the duplexer 62 is connected to a terminal 513X of the switch 51X, the duplexer 63 is connected to a terminal 514X of the switch 51X via a matching circuit 71X, and the transmit/receive filter 64 is connected to a terminal 515X of the switch 51X via a matching circuit 72X.

In the case where the simultaneous communication of the communication bands A and B is performed in the radio frequency circuit 1X described above, as illustrated in FIG. 3, for example, the RFIC 3 causes the switch 51X to connect the terminals 512X and 513X to a terminal 511X and to connect neither the terminal 514X nor 515X to the terminal 511X. Because of this, a transmit signal of the communication band A is transmitted from the RFIC 3 to the antenna 2 via the radio frequency input terminal 111, the power amplifier 11, the transmit filter 61T, the switch 51X, and the antenna connection terminal 100. Further, a receive signal of the communication band A is transmitted from the antenna 2 to the RFIC 3 via the antenna connection terminal 100, the switch 51X, the receive filter 61R, the low-noise amplifier 21, and the radio frequency output terminal 121. Further, a transmit signal of the communication band B is transmitted from the RFIC 3 to the antenna 2 via the radio frequency input terminal 112, the power amplifier 12, the transmit filter 62T, the switch 51X, and the antenna connection terminal 100. Further, a receive signal of the communication band B is transmitted from the antenna 2 to the RFIC 3 via the antenna connection terminal 100, the switch 51X, the receive filter 62R, the low-noise amplifier 22, and the radio frequency output terminal 122.

As is evident from FIG. 2 and FIG. 3, during the simultaneous communication of the communication bands A and B, the number of unconnected terminals of the switch 51X is two (terminals 513X and 514X) in the radio frequency circuit 1X according to the comparative example, whereas the number of unconnected terminals of the switch 51 is one (terminal 513) in the radio frequency circuit 1 according to the present embodiment. Accordingly, in the present embodiment, during the simultaneous communication of the communication bands A and B, it becomes possible to reduce the off-capacitance of the switch and improve the pass characteristics of the switch compared with the comparative example. This enables the improvement of signal quality during the simultaneous communication of the communication band A and B.

Further, for example, in the radio frequency circuit 1 according to the present embodiment, the communication bands C and D may overlap with each other at least partially.

This enables to connect the communication bands C and D, which are a combination of communication bands that are basically not used for simultaneous communication, to the switch 52 and enables to connect the communication bands A and B, which are available for simultaneous communication, to the switch 51. Accordingly, it becomes possible to effectively reduce the off-capacitance of the switch 51 during the simultaneous communication of the communication bands A and B, and this enables a more effective improvement of signal quality.

Further, for example, the radio frequency circuit 1 according to the present embodiment may further include the matching circuit 71 connected between the terminal 514 of the switch 51 and the terminal 521 of the switch 52.

This enables the single matching circuit 71 to provide impedance matching for the input impedances of the duplexer 63 and the transmit/receive filter 64 for the communication bands C and D that overlap with each other at least partially. Accordingly, it becomes possible to reduce the number of matching circuits compared with the case where the duplexer 63 and the transmit/receive filter 64 are separately connected to matching circuits (for example, matching circuits 71X and 72X of FIG. 3).

Further, for example, in the radio frequency circuit 1 according to the present embodiment, the communication band A may be a communication band available for simultaneous communication with the communication band C.

Because of this, the communication bands A and C are available for simultaneous communication, and thus it becomes possible to realize the simultaneous communication of the communication bands A and C by simultaneously connecting the terminals 512 and 514 to the terminal 511 in the switch 51 and by connecting the terminal 522 to the terminal 521 in the switch 52.

Further, for example, in the radio frequency circuit 1 according to the present embodiment, the communication band A may be a communication band available for simultaneous communication with the communication band D.

Because of this, the communication bands A and D are available for simultaneous communication, and thus by simultaneously connecting the terminals 512 and 514 to the terminal 511 in the switch 51 and by connecting the terminal 523 to the terminal 521 in the switch 52, it becomes possible to realize the simultaneous communication of the communication bands A and D.

Further, for example, in the radio frequency circuit 1 according to the present embodiment, the communication band A may be Band 1 for LTE or n1 for 5GNR, the communication band B may be Band 3 for LTE or n3 for 5GNR, the communication band C may be Band 7 for LTE or n7 for 5GNR, and the communication band D may be Band 41 for LTE or n41 for 5GNR.

According to this, in the radio frequency circuit 1 that can transmit a signal of Band 1 for LTE or n1 for 5GNR, a signal of Band 3 for LTE or n3 for 5GNR, a signal of Band 7 for LTE or n7 for 5GNR, and a signal of Band 41 for LTE or n41 for 5GNR, it becomes possible to improve signal quality during the simultaneous communication of Band 1 or n1 and Band 3 or n3.

Further, the radio frequency circuit 1 according to the present embodiment includes the switch 51 and the switch 52. The switch 51 includes the terminal 511 connected to the antenna connection terminal 100 and the terminals 512 to 513 that can be connected to the terminal 511, and at least the terminals 512 and 513 can be simultaneously connected to the terminal 511. The switch 52 includes the terminal 521 connected to the terminal 514 and the terminals 522 and 523 that can be connected to the terminal 521.

This enables to connect the terminal 514 of the switch 51 to the terminal 521 of the switch 52, to which two filters (for example, the duplexer 63 and the transmit/receive filter 64) can be connected. Accordingly, in the switch 51, in the case where the terminals 512 and 513 are simultaneously connected to the terminal 511, it becomes possible to reduce the number of unconnected terminals of the switch 51. As a result, it becomes possible to reduce the off-capacitance of the switch 51, suppress an increase in reflection coefficient due to degradation of the impedance matching, and improve the pass characteristics of the switch 51.

Further, the communication device 5 according to the present embodiment includes the RFIC 3 that performs processing on a radio frequency signal and the radio frequency circuit 1 that transmits a radio frequency signal in between the RFIC 3 and the antenna 2.

This enables the communication device 5 enables to realize substantially the same effects as the radio frequency circuit 1.

Note that the communication device 5 according to the present embodiment is a device capable of both transmitting and receiving. Alternatively, the communication device 5 according to the present embodiment may be a device capable of only one of transmitting and receiving. In that case, the radio frequency circuit 1 does not need to include one of the power amplifier and the low-noise amplifier, one of the transmit filter and the receive filter, and the like.

Embodiment 2

Next, the embodiment 2 is described. In the present embodiment, a radio frequency module 1A is described as an implementation example of the radio frequency circuit 1 according to the embodiment 1.

[2.1 Component Arrangement of Radio Frequency Module 1A]

Figure 4:
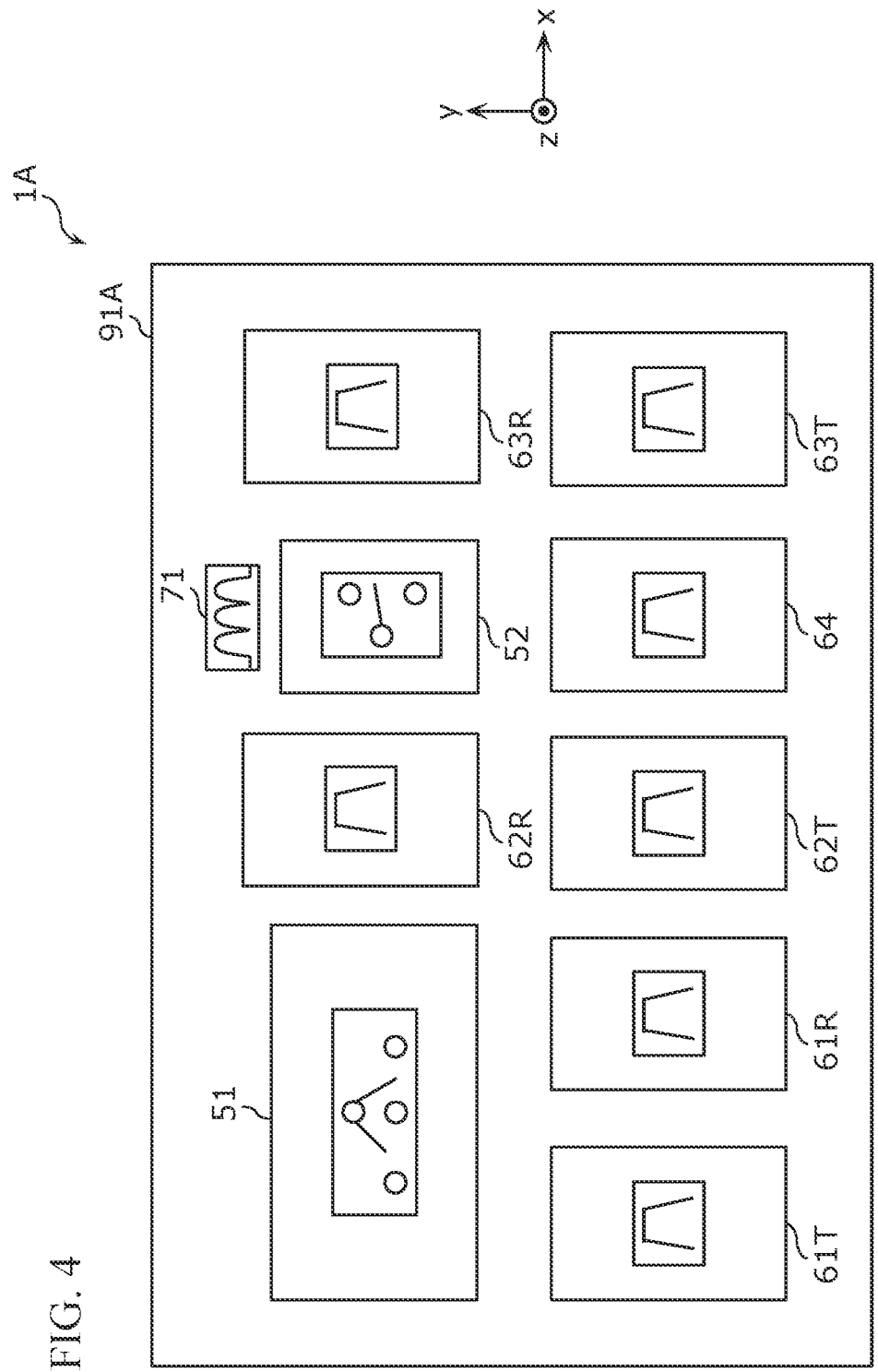
FIG. 4 is a plan view of a radio frequency module according to an embodiment 2.

FIG. 4 is a plan view of the radio frequency module 1A according to the embodiment 2. As illustrated in FIG. 4, in the radio frequency module 1A, some of circuit components that constitute the radio frequency circuit 1 according to the embodiment 1 are mounted on one side of a module board 91A. Specifically, on the module board 91A, as illustrated in FIG. 4, the switches 51 and 52, the transmit filters 61T, 62T, and 63T, the receive filters 61R, 62R, and 63R, the transmit/receive filter 64, and the matching circuit 71 are arranged.

As the module board 91A, for example, a low temperature co-fired ceramics (LTCC) board, a high temperature co-fired ceramics (HTCC) board, a board with embedded components, a board including a redistribution layer (RDL), a printed board, or the like, each of which has a multilayer structure including a plurality of dielectric layers, can be used, but the module board 91A is not limited thereto.

Each of the switches 51 and 52 is, for example, embedded in a semiconductor component. The semiconductor component is an electronic component including an electronic circuit formed on a surface or in the inside of a semiconductor chip (also referred to as "die") and is also referred to as a semiconductor integrated circuit. The semiconductor component may be made up of, for example, CMOS (Complementary Metal Oxide Semiconductor), and specifically, may be fabricated by SOI (Silicon on Insulator) process. This enables to fabricate the semiconductor components inexpensively. Note that the semiconductor component may be composed of at least one of GaAs, SiGe, and GaN. This enables to realize high quality semiconductor components.

Note that the switches 51 and 52 may be embedded in a single semiconductor component. This enables to reduce the size of the radio frequency module 1A.

The transmit filters 61T, 62T, and 63T, the receive filters 61R, 62R, and 63R, and the transmit/receive filter 64 may each be, for example, a surface acoustic wave filter, an acoustic wave filter using a BAW (Bulk Acoustic Wave), a LC resonance filter, or a dielectric filter, but they are not limited thereto.

The matching circuit 71 includes, for example, an inductor and/or a capacitor and is made up of one or more surface mount devices (SMD). Note that the matching circuit 71 may be formed in the inside of the module board 91A or may be made up of an integrated passive device (IPD).

As illustrated in FIG. 4, the transmit filters 61T and 62T and the receive filters 61R and 62R are arranged in the vicinity of the switch 51, and the transmit filter 63T, the receive filter 63R, and the transmit/receive filter 64 are arranged in the vicinity of the switch 52. That is to say, the transmit filter 63T, the receive filter 63R, and the transmit/receive filter 64 are arranged closer to the switch 52 than the switch 51.

[2.2 Effects and the Like]

As described above, in the radio frequency module 1A according to the present embodiment, the transmit filters 61T and 62T and the receive filters 61R and 62R are arranged in the vicinity of the switch 51, and the transmit filter 63T, the receive filter 63R, and the transmit/receive filter 64 are arranged in the vicinity of the switch 52.

This enables to shorten the length of the wiring line connecting each filter and the switch, reduce mismatching loss caused by wiring loss and wiring variation, and improve electrical characteristics (for example, noise figure (NF), gain characteristic, and the like) of the radio frequency module 1A.

Embodiment 3

Next, the embodiment 3 is described. In the present embodiment, a radio frequency module 1B is described as an implementation example of the radio frequency circuit according to the embodiment 1. Note that the present embodiment is mainly different from the foregoing embodiment 2 in that the circuit components are arranged on both sides of the module board. Hereinbelow, the present embodiment is described with the emphasis on points different from the foregoing embodiment 2.

[3.1 Component Arrangement of Radio Frequency Module 1B]

Figure 5A:
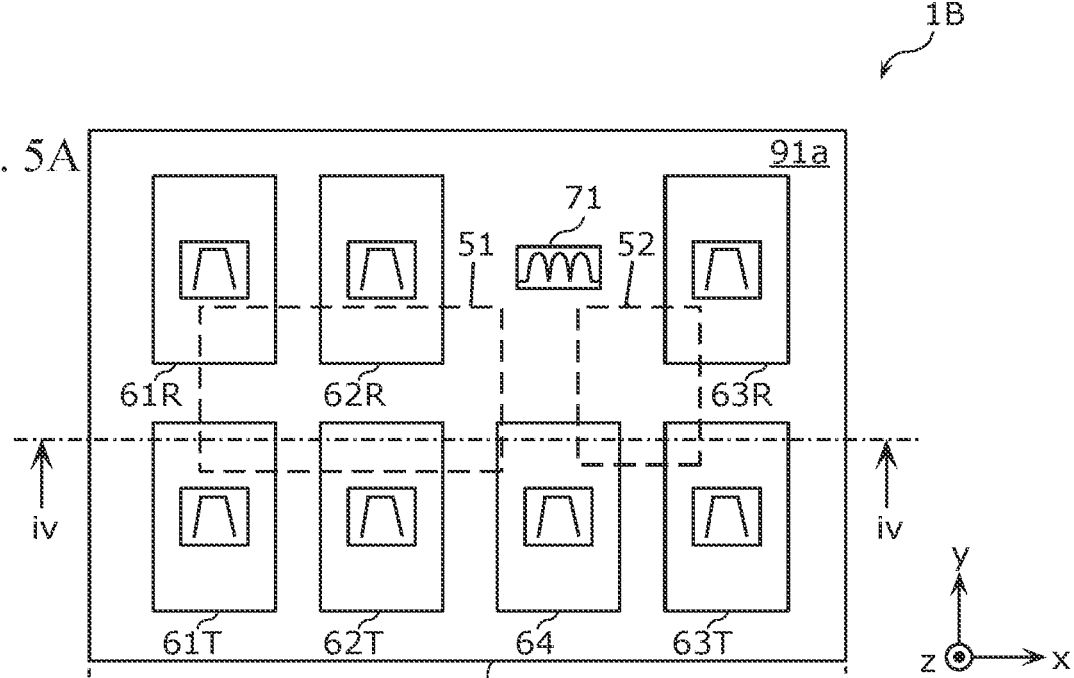
FIGS. 5A and 5B are plan views of a radio frequency module according to an embodiment 3.
Figure 5B:
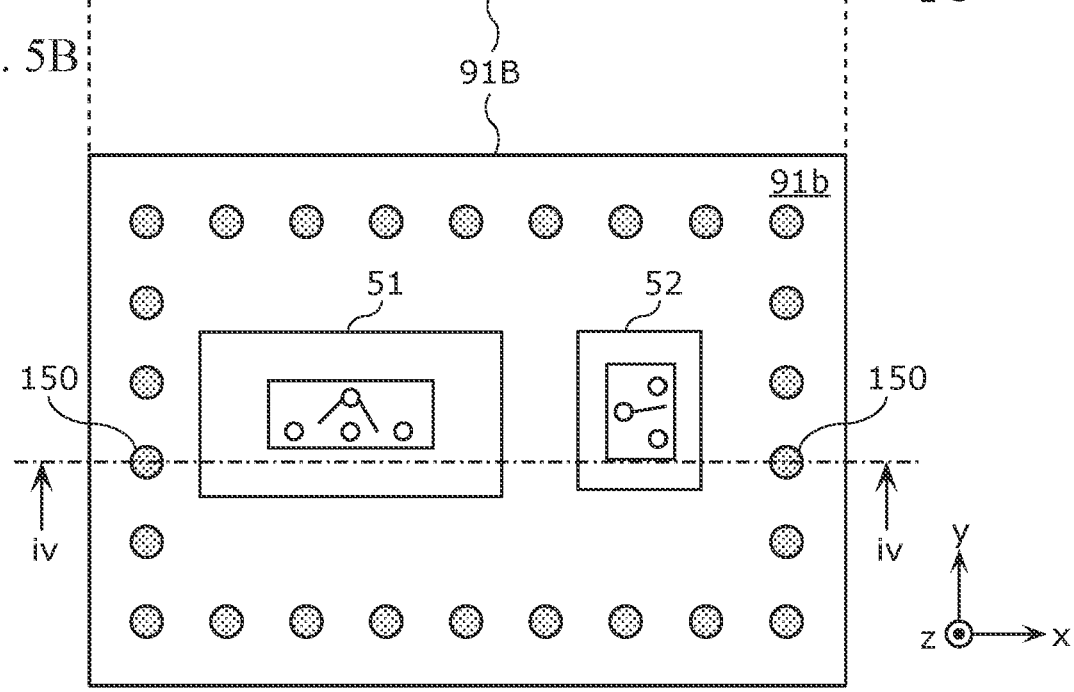
Figure 6:
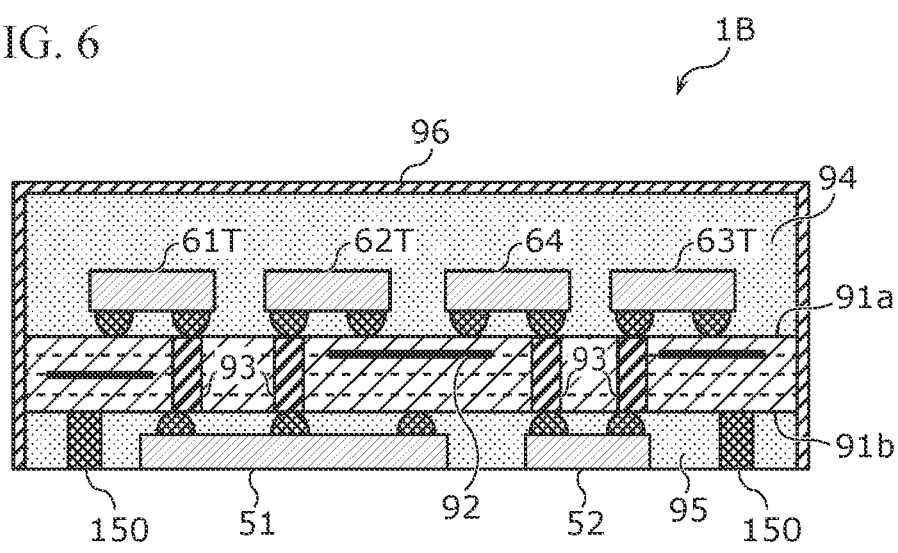
FIG. 6 is a cross-sectional view of the radio frequency module according to the embodiment 3.
Figure 6:
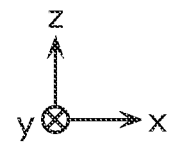

FIGS. 5A and 5B are plan views of the radio frequency module 1B according to the embodiment 3. FIG. 5A illustrates a view of a principal surface 91a of a module board 91B viewed from the positive side of the z-axis, and FIG. 5B illustrates a transparent view of a principal surface 91b of the module board 91B viewed from the positive side of the z-axis. In FIG. 5A, the dashed line denotes the circuit component on the principal surface 91b side of the module board 91B. FIG. 6 is a cross-sectional view of the radio frequency module 1B according to the embodiment 3. The cross section of the radio frequency module 1B in FIG. 6 is a cross section cut along the line iV-iV of FIGS. 5A and 5B.

As illustrated in FIGS. 5A, 5B, and FIG. 6, instead of the module board 91A, the radio frequency module 1B includes a module board 91B. Moreover, the radio frequency module 1B includes resin members 94 and 95, a shield electrode layer 96, and a plurality of post electrodes 150. Note that in FIGS. 5A and 5B, the illustration of the resin members 94 and 95 and the shield electrode layer 96 is omitted.

The module board 91B has a principal surface 91a and a principal surface 91b, which face each other. Inside the module board 91B, ground electrode patterns 92 and via conductors 93 are formed. As is the case with the module board 91A, for the module board 91B, for example, a LTCC board, a HTCC board, a board with embedded components, a board including an RDL, a printed board, or the like can be used, but the module board 91B is not limited thereto.

The principal surface 91a is an example of a first principal surface and in some cases is also referred to an upper surface or a top surface. As illustrated in FIG. 5A, the transmit filters 61T, 62T, and 63T, the receive filters 61R, 62R, and 63R, the transmit/receive filter 64, the matching circuit 71, and the resin members 94 are arranged on the principal surface 91a.

The resin member 94 covers the circuit components on the principal surface 91a and has the capability of ensuring reliability of mechanical strength, moisture resistance, and the like of those circuit components.

The principal surface 91b is an example of a second principal surface and in some cases is also referred to a lower surface or a back surface. As illustrated in FIG. 5B, the switches 51 and 52, the resin member 95, and the plurality of post electrodes 150 are arranged on the principal surface 91b.

The resin member 95 covers the circuit components on the principal surface 91b and has the capability of ensuring reliability of mechanical strength, moisture resistance, and the like of those circuit components.

The plurality of post electrodes 150 constitutes a plurality of external connection terminals including the antenna connection terminal 100, the radio frequency input terminals 111 to 113, and the radio frequency output terminals 121 to 123. Each of the plurality of post electrodes 150 extends vertically from the principal surface 91b, penetrates the resin member 95, and exposes its one end to outside the resin member 95. One end of each of the plurality of post electrodes 150 being exposed to outside the resin member 95 is connected to an input/output terminal, a ground electrode, and/or the like provided on a mother board arranged in the negative direction of the z-axis of the radio frequency module 1B.

The shield electrode layer 96 is, for example, a thin metal film formed by sputtering and is formed in such a manner as to cover an upper surface and side surfaces of the resin member 94, side surfaces of the module board 91B and the resin member 95. The shield electrode layer 96 is set at a ground potential and suppresses external noise entering the circuit components included in the radio frequency module 1B.

As illustrated in FIG. 5A, in the plan view of the module board 91B, the switch 52 overlaps each of the transmit filter 63T, the receive filter 63R, and the transmit/receive filter 64. Further, as illustrated in FIG. 6, the switch 52 is connected to the transmit filter 63T and the transmit/receive filter 64 via the via conductors 93 formed in the inside of the module board 91B. Similarly, the switch 52 is connected to the receive filter 63R via a via conductor (not illustrated) formed in the inside of the module board 91B.

Moreover, in the plan view of the module board 91B, the switch 51 overlaps each of the transmit filters 61T and 62T and the receive filters 61R and 62R. The switch 51 is connected to the transmit filters 61T and 62T via the via conductors 93 formed in the inside of the module board 91B. Similarly, the switch 52 is connected to the receive filters 61R and 62R via the via conductors (not illustrated) formed in the inside of the module board 91B.

The via conductor 93 is a conductor made by filling a through-via penetrating through the module board 91B along the z-axis. Note that the via conductor 93 is not limited to the conductor made by filling a through-via. For example, the via conductor 93 may be made up of a conductor made by filling a blind-via formed on the principal surface 91a side, a conductor made by filling a blind-via formed on the principal surface 91b side, and a plane electrode pattern that connects the conductors made by filling two blind-vias in the inside of the module board 91B.

[3.2 Effects and the Like]

As described above, the radio frequency module 1B according to the present embodiment includes the switch 51 that includes the terminal 511 connected to the antenna connection terminal 100 and the terminals 512 to 514, the duplexer 61 that is connected to the terminal 512 and has a pass band including the communication band A, the duplexer 62 that is connected to the terminal 513 and has a pass band including the communication band B which is available for simultaneous communication with the communication band A, the switch 52 that includes the terminal 521 connected to the terminal 514 and the terminals 522 and 523, the duplexer 63 that is connected to the terminal 522 and has a pass band including the communication band C, the transmit/receive filter 64 that is connected to the terminal 523 and has a pass band including the communication band D, and the module board 91B that has the principal surfaces 91a and 91b, which face each other, wherein the switch 52 is arranged on one of the principal surfaces 91a and 91b, the duplexer 63 and the transmit/receive filter 64 are arranged on the other of the principal surfaces 91a and 91b, and in the plan view of the module board 91B, the switch 52 overlaps each of the duplexer 63 and the transmit/receive filter 64.

This enables to arrange the circuit components on both sides of the module board 91B. Thus, it becomes possible to reduce the size of the radio frequency module 1B. Moreover, in the plan view of the module board 91B, it becomes possible to make the switch 52 overlap each of the duplexer 63 and the transmit/receive filter 64. Accordingly, it becomes possible to shorten the length of a wiring line connecting the switch 52 and each of the duplexer 63 and the transmit/receive filter 64. As a result, it becomes possible to reduce mismatching loss caused by wiring loss and wiring variation and improve electrical characteristics of the radio frequency module 1B.

Further, for example, in the radio frequency module 1B according to the present embodiment, the switch 51 may be arranged on one of the principal surfaces 91a and 92b, the duplexers 61 and 62 may be arranged on the other of the principal surfaces 91a and 92b, and in the plan view of the module board 91B, the switch 51 may overlap each of the duplexers 61 and 62.

This enables to shorten the length of a wiring line connecting the switch 51 and each of the duplexers 61 and 62. Accordingly, it becomes possible to reduce mismatching loss caused by wiring loss and wiring variation and improve electrical characteristics of the radio frequency module 1B.

Further, for example, the radio frequency module 1B according to the present embodiment may further include a plurality of post electrodes 150 as a plurality of external connection terminals, wherein the duplexers 61, 62, and 63 and the transmit/receive filter 64 may be arranged on the principal surface 91a, and the switches 51 and 52 and the plurality of post electrodes 150 may be arranged on the principal surface 91b.

This enables to arrange components having relatively low profile heights on the principal surface 91b on which the plurality of post electrodes 150 is arranged and contribute to the reduction of the profile height of the radio frequency module 1B.

Note that in the present embodiment, the switches 51 and 52 are arranged on the same principal surface 91b. However, the switches 51 and 52 may be arranged on mutually different principal surfaces 91a and 91b. For example, the switch 51 may be arranged on the principal surface 91b, and the switch 52 may be arranged on the principal surface 91a. In that case, the duplexers 61 and 62 may be arranged on the principal surface 91a, and the duplexer 63 and the transmit/receive filter 64 may be arranged on the principal surface 91b. Even in that case, it becomes possible to shorten the length of the wiring line connecting the switch 51 and each of the duplexers 61 and 62 and the length of the wiring line connecting the switch 52 and each of the duplexer 63 and the transmit/receive filter 64.

Embodiment 4

Next, the embodiment 4 is described. In the present embodiment, a radio frequency module 1C is described as an implementation example of the radio frequency circuit according to the embodiment 1. Note that the present embodiment is mainly different from the foregoing embodiment 3 in the arrangement of the circuit components. Hereinbelow, the present embodiment is described with the emphasis on points different from the foregoing embodiment 3.

[4.1 Component Arrangement of Radio Frequency Module 1C]

Figure 7A:
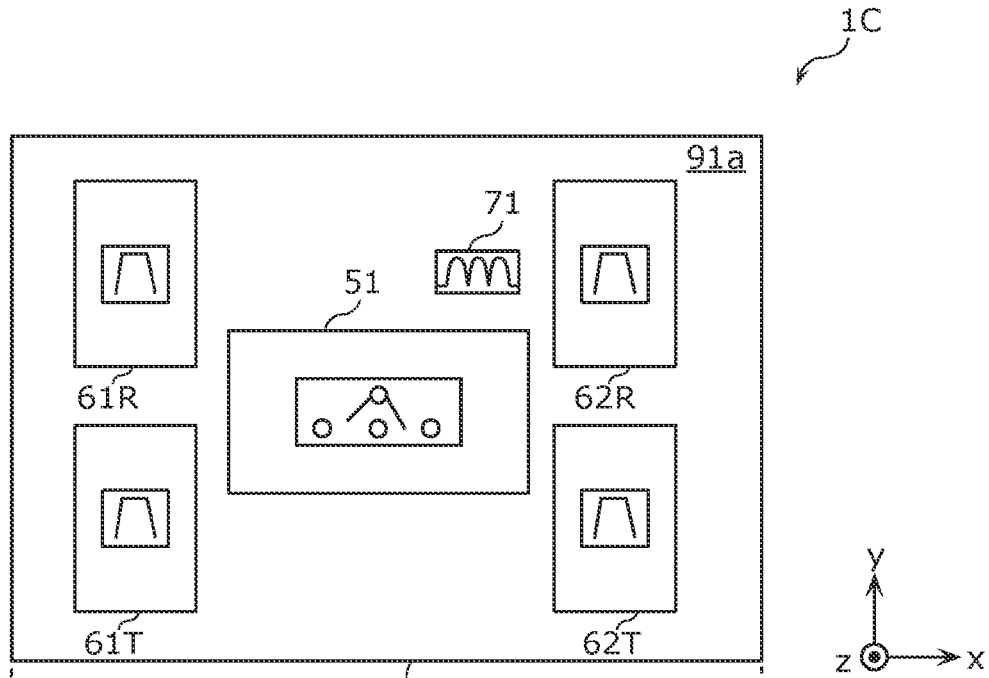
FIGS. 7A and 7B are plan views of a radio frequency module according to an embodiment 4.
Figure 7B:
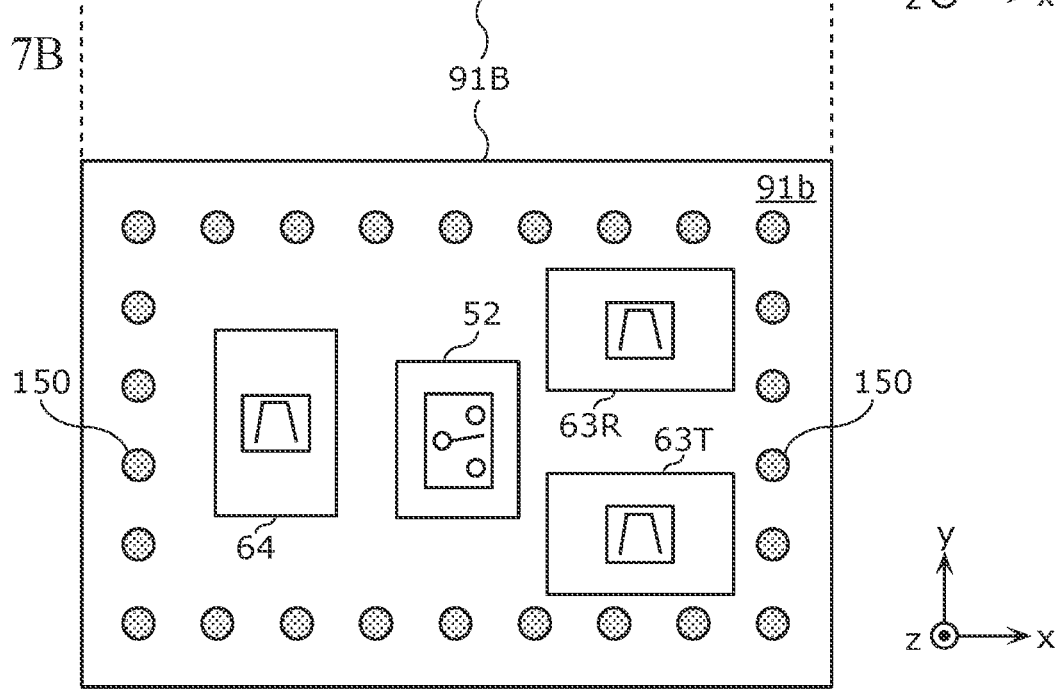

FIGS. 7A and 7B are plan views of the radio frequency module 1C according to the embodiment 4. FIG. 7A illustrates a view of the principal surface 91a of the module board 91B viewed from the positive side of the z-axis, and (b) illustrates a transparent view of the principal surface 91b of the module board 91B viewed from the positive side of the z-axis. Note that in FIGS. 7A and 7B, as is the case with FIGS. 5A and 5B, the illustration of the resin members 94 and 95 and the shield electrode layer 96 is omitted.

As illustrated in FIG. 7A, the transmit filters 61T and 62T, the receive filters 61R and 62R, the matching circuit 71, the switch 51, and the resin members 94 are arranged on the principal surface 91a. That is to say, the switch 51 is arranged on the same plane as the transmit filters 61T and 62T and the receive filters 61R and 62R.

As illustrated in FIG. 7B, the transmit filter 63T, the receive filter 63R, the transmit/receive filter 64, the switch 52, the resin members 95, a plurality of post electrodes 150 are arranged on the principal surface 91b. That is to say, the switch 52 is arranged on the same plane as the transmit filter 63T, the receive filter 63R, and the transmit/receive filter 64.

[4.2 Effects and the Like]

As described above, in the radio frequency module 1C according to the present embodiment, the switch 51 and the duplexers 61 and 62 are arranged on the principal surface 91a, and the switch 52, the duplexer 63, and the transmit/receive filter 64 are arranged on the principal surface 91b.

This enables to shorten the lengths of the wiring lines connecting the switch 51 to the duplexers 61 and 62 by arranging the switch 51 and the duplexers 61 and 62 to be connected to the switch 51 on the same principal surface 91a. Similarly, this also enables to shorten the lengths of the wiring lines connecting the switch 52 to the duplexer 63 and the transmit/receive filter 64 by arranging the switch 52 and the duplexer 63 and the transmit/receive filter 64, which are connected to the switch 52, on the same principal surface 91b.

Other Embodiments

The radio frequency modules and the communication devices according to the present disclosure are described using the embodiments. However, the radio frequency module and the communication device according to the present disclosure are not limited to the foregoing embodiments. Other embodiments realized by combining optional constituent elements of the foregoing embodiments, modified examples obtained by applying various modifications conceivable to those skilled in the art to the foregoing embodiments without necessarily departing the scope of the present disclosure, and various devices incorporating the foregoing radio frequency modules and communication devices may also be included in the present disclosure.

For example, in the circuit configurations of the radio frequency modules and the communication devices according to the foregoing embodiments, another circuit element, wiring, or the like may be inserted in a path connecting a circuit element and a signal path disclosed in the drawings. For example, an impedance matching circuit may be inserted between the switch 53 and each of the duplexers 61 and 62. The impedance matching circuit can be made up of, for example, an inductor and/or a capacitor.

Note that in the foregoing embodiments 2 to 4, the radio frequency module includes a plurality of post electrodes 150 as a plurality of external connection terminals. However, the configuration of the radio frequency module is not limited thereto. For example, the radio frequency module may include a plurality of bump electrodes instead of a plurality of post electrodes 150.

Note that in the foregoing embodiments 2 to 4, the radio frequency module includes various filters and the matching circuit. However, the radio frequency module does not need to include these various filters and the matching circuit. Further, the radio frequency module may include the power amplifiers 11 to 13, the low-noise amplifiers 21 to 23, and the switch 53. In that case, the arrangement of the power amplifiers 11 to 13, the low-noise amplifiers 21 to 23, and the switch 53 is not specifically limited.

INDUSTRIAL APPLICABILITY

The present disclosure can be widely used in communication equipment such as mobile phones and the like as a radio frequency circuit or a radio frequency module to be installed in a front-end unit.

REFERENCE SIGNS LIST

1 Radio frequency circuit
1A, 1B, 1C Radio frequency module
2 Antenna
3 RFIC
4 BBIC
5 Communication device
11, 12, 13 Power amplifier
21, 22, 23 Low-noise amplifier
51, 52, 53 Switch
61, 62, 63 Duplexer
61R, 62R, 63R Receive filter
61T, 62T, 63T Transmit filter
64 Transmit/receive filter
91A, 91B Module board
91a, 91b Principal surface
92 Ground electrode pattern
93 Via conductor
94, 95 Resin member
96 Shield electrode layer
100 Antenna connection terminal
111, 112, 113 Radio frequency input terminal
121, 122, 123 Radio frequency output terminal
150 Post electrode

The invention claimed is:

1. A radio frequency circuit comprising:
a first switch including a first terminal connected to an antenna connection terminal, a second terminal, a third terminal, and a fourth terminal;
a first filter connected to the second terminal, the first filter having a pass band including a first communication band;
a second filter connected to the third terminal, the second filter having a pass band including a second communication band, the second communication band being available for simultaneous communication with the first communication band;
a second switch including a fifth terminal connected to the fourth terminal, a sixth terminal, and a seventh terminal;
a third filter connected to the sixth terminal, the third filter having a pass band including a third communication band; and
a fourth filter connected to the seventh terminal, the fourth filter having a pass band including a fourth communication band.

2. The radio frequency circuit according to claim 1, wherein the third communication band and the fourth communication band at least partially overlap one another.

3. The radio frequency circuit according to claim 2, further comprising:
a matching circuit connected between the fourth terminal of the first switch and the fifth terminal of the second switch.

4. The radio frequency circuit according to claim 1, wherein the first communication band is a communication band available for simultaneous communication with the third communication band.

5. The radio frequency circuit according to claim 4, wherein the first communication band is a communication band available for simultaneous communication with the fourth communication band.

6. The radio frequency circuit according to claim 1, wherein the first communication band is Band 1 of Long Term Evolution (LTE) or Band n1 of 5th Generation New Radio (5GNR).

7. The radio frequency circuit according to claim 1, wherein the second communication band is Band 3 of Long Term Evolution (LTE) or Band n3 of 5th Generation New Radio (5GNR).

8. The radio frequency circuit according to claim 1, wherein the third communication band is Band 7 of Long Term Evolution (LTE) or Band n7 of 5th Generation New Radio (5GNR).

9. The radio frequency circuit according to claim 1, wherein the fourth communication band is Band 41 of Long Term Evolution (LTE) or Band n41 of 5th Generation New Radio (5GNR).

10. A radio frequency circuit comprising:
a first switch including a first terminal connected to an antenna connection terminal, a second terminal, a third terminal, and a fourth terminal; and
a second switch including a fifth terminal connected to the fourth terminal, a sixth terminal, and a seventh terminal,
wherein the second terminal, the third terminal, and the fourth terminal are configured to selectively connect to the first terminal,
wherein at least the second terminal and the third terminal are configured to simultaneously connect to the first terminal, and
wherein the sixth terminal and the seventh terminal are configured to selectively connect to the fifth terminal.

11. A radio frequency module comprising:
a first switch including a first terminal connected to an antenna connection terminal, a second terminal, a third terminal, and a fourth terminal;
a first filter connected to the second terminal, the first filter having a pass band including a first communication band;
a second filter connected to the third terminal, the second filter having a pass band including a second communication band, the second communication band being available for simultaneous communication with the first communication band;
a second switch including a fifth terminal connected to the fourth terminal, a sixth terminal, and a seventh terminal;
a third filter connected to the sixth terminal, the third filter having a pass band including a third communication band;
a fourth filter connected to the seventh terminal, the fourth filter having a pass band including a fourth communication band; and
a module board having a first principal surface and a second principal surface, the first principal surface and the second principal surface facing one another,
wherein the second switch is physically arranged on the first principal surface or the second principal surface, wherein the third filter and the fourth filter are physically arranged on another of the first principal surface or the second principal surface, and wherein in a plan view of the module board, the second switch overlaps each of the third filter and the fourth filter.

12. The radio frequency module according to claim 11, wherein the first switch is physically arranged on the first principal surface or the second principal surface, wherein the first filter and the second filter are physically arranged on another of the first principal surface or the second principal surface, and wherein in the plan view of the module board, the first switch overlaps each of the first filter and the second filter.

13. The radio frequency module according to claim 12, further comprising:

a plurality of external connection terminals, wherein the first filter, the second filter, the third filter, and the fourth filter are physically arranged on the first principal surface, and wherein the first switch, the second switch, and the plurality of external connection terminals are physically arranged on the second principal surface.

14. A communication device comprising:

a signal processing circuit configured to process a radio frequency signal; and the radio frequency circuit according to claim 1, the radio frequency circuit being configured to transmit the radio frequency signal between the signal processing circuit and an antenna connected to the antenna connection terminal.

15. A communication device comprising:

a signal processing circuit configured to process a radio frequency signal; and the radio frequency circuit according to claim 10, the radio frequency circuit being configured to transmit the radio frequency signal between the signal processing circuit and an antenna connected to the antenna connection terminal.

16. A communication device comprising:

a signal processing circuit configured to process a radio frequency signal; and the radio frequency module according to claim 11, the radio frequency module being configured to transmit the radio frequency signal between the signal processing circuit and an antenna connected to the antenna connection terminal.

* * * * *